United States Patent [19]
Lee

[11] Patent Number: 5,973,560
[45] Date of Patent: Oct. 26, 1999

[54] AUTOMATIC GAIN CONTROL CIRCUIT USING MULTIPLIER AND NEGATIVE FEEDBACK SYSTEM

[75] Inventor: Jung Bong Lee, Daeku, Rep. of Korea

[73] Assignee: LG Semicon Co., Ltd., Cheongju, Rep. of Korea

[21] Appl. No.: 09/124,911

[22] Filed: Jul. 30, 1998

[30] Foreign Application Priority Data

Apr. 16, 1998 [KR] Rep. of Korea ............. 98-13622

[51] Int. Cl.[6] .................................................. H03G 3/20
[52] U.S. Cl. ................................... 330/136; 330/85
[58] Field of Search ............................. 330/136, 282, 330/85, 86, 140, 284

[56] References Cited

U.S. PATENT DOCUMENTS 3,588,725  6/1971  Geffe ............................................. 330/21
4,398,153  8/1983  Rittenbach ...................................... 328/16

FOREIGN PATENT DOCUMENTS 2-7708  1/1990  Japan ............................................. 330/136

OTHER PUBLICATIONS

"Bipolar and MOS Analog Integrated Circuit Design", Alan B. Grebene, John Wiley & Sons, Copyright 1991, pp. 443–459.

*Primary Examiner*—Benny Lee
*Assistant Examiner*—Henry Choe
*Attorney, Agent, or Firm*—Fleshner & Kim

[57] ABSTRACT

An automatic gain control circuit and method is provided that constantly outputs uniform output signal size regardless of size change of an input signal. The automatic gain control circuit uses a multiplier and a negative feedback system. The automatic gain control circuit includes an amplitude detector detecting an amplitude of an input signal, a comparator, a multiplier multiplying the amplitude detected in the amplitude detector and an output signal. The output signal is fed back to the multiplier. The comparator has an inverting terminal coupled to an output terminal of the multiplier across a first resistance and coupled to an input terminal receiving the input signal across a second resistance. A non-inverting terminal of the comparator is grounded. The automatic gain control circuit and in particular, the comparator, supplies the output signal of which size is determined by the ratio of the first resistance and the second resistance regardless of the size of the input signal.

16 Claims, 3 Drawing Sheets

AUTOMATIC GAIN CONTROL CIRCUIT USING MULTIPLIER AND NEGATIVE FEEDBACK SYSTEM

BACKGROUND OF THE INVENTION

1. Field of the Invention

The present invention relates to an automatic gain control circuit, and more particularly, to an automatic gain control circuit that generates a uniform size output signal regardless of an input signal size.

2. Background of the Related Art

Since size of a signal that is supplied to a receiving unit of a terminal or a communication system varies because of varied distances between relay stations, an automatic gain control circuit is required to output a uniform sized signal. FIG. 1 is a block diagram illustrating a related art automatic gain control circuit that is composed of a variable gain amplifier 10 varying gain of an input signal (Vin) and a control voltage generator 20. The control voltage generator 20 generates a control voltage (Vagc) that is inversely proportional to size of an output signal (Vout) of the variable gain amplifier 10. The variable gain amplifier 10 is composed of a multiplier.

Referring to FIG. 1, the operation of the related art automatic gain control circuit will now be described. When the input signal (Vin) is externally initially applied, the variable gain amplifier 10 outputs the output signal (Vout), which has uniform gain. The control voltage generator 20 receives the output signal (Vout) from the variable gain amplifier 10 and generates a control signal (Vagc), which is inversely proportional to size of the output signal (Vout). The control signal (Vagc) is fed back to the variable gain amplifier 10, which multiplies the external input signal (Vin) and the control signal (Vagc). Thus, the final output signal (Vout) is generated with a uniform size.

For example, if the input signal (Vin) is $A \sin\omega t$, the final output signal (Vout) can be expressed in equation (1) as follows.

$$Vout = Vin * Vagc \qquad (1)$$
$$= A * Vagc * \sin\omega t$$

Thus, the final output signal (Vout) has the size of $A*Vagc$.

As described above, the related art automatic gain control circuit has various problems. It is very difficult to embody a circuit such as the control voltage generator 20 required by the related art automatic gain control circuit that generates the control voltage (Vagc), which is inversely proportional to the size of the output signal (Vout). The control voltage generator required by the related art automatic gain control circuit varies for each system in which it is incorporated.

The above references are incorporated by reference herein where appropriate for appropriate teachings of additional or alternative details, features and/or technical background.

SUMMARY OF THE INVENTION

An object of the present invention is to provide an automatic gain control circuit that substantially obviates one or more of the problems or disadvantages caused by the related art.

Another object of the present invention is to provide an automatic gain control circuit that uses a multiplier and a negative feedback system.

Another object of the present invention is to provide an automatic gain control circuit that obtains an output signal having a prescribed size regardless of an input signal size.

Another object of the present invention is to provide an automatic gain control circuit that does not require a circuit that generates an inversely proportional signal.

To achieve at least these objects and other advantages in a whole or in parts and in accordance with the purpose of the present invention, as embodied and broadly described, an automatic gain control circuit includes an amplitude detector that detects an input signal amplitude, a multiplier multiplying the detected amplitude and an output signal of the automatic gain control circuit, a first resistance coupled to the multiplier where a first side of the first resistance receives a signal outputted from the multiplier, a second resistance where a first side of the second resistance receives the input signal, and an operational amplifier comparing signals applied to inversion and non-inversion terminals to output the output signal of the automatic gain control circuit, wherein second sides of the first and second resistances are mutually coupled to the inversion terminal of the operational amplifier and a first prescribed voltage is coupled to the non-inversion terminal of the operational amplifier.

To further achieve the above objects and other advantages in a whole or in parts and in accordance with the purpose of the present invention, as embodied and broadly described, an automatic gain control circuit includes an amplitude detector that detects an input signal amplitude, a multiplier that multiplies the input signal amplitude and an output signal of the automatic gain control circuit and a comparator having inversion and non-inversion terminals, wherein the inversion terminal is coupled to an output terminal of the multiplier across a first resistance and to an input terminal supplying the input signal across a second resistance.

To further achieve the above objects and other advantages in a whole or in parts and in accordance with the purpose of the present invention, as embodied and broadly described, a method of automatic gain control includes inputting an input signal; amplifying the input signal to generate a uniform size output signal; detecting an amplitude of the input signal; and multiplying the amplitude of the input signal and the uniform size output signal to generate a multiplied signal, where the amplifying step further includes receiving the input signal applied across a second resistance, receiving the multiplied signal applied across a first resistance, and comparing the two received signals to a prescribed voltage to output the uniform size output signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
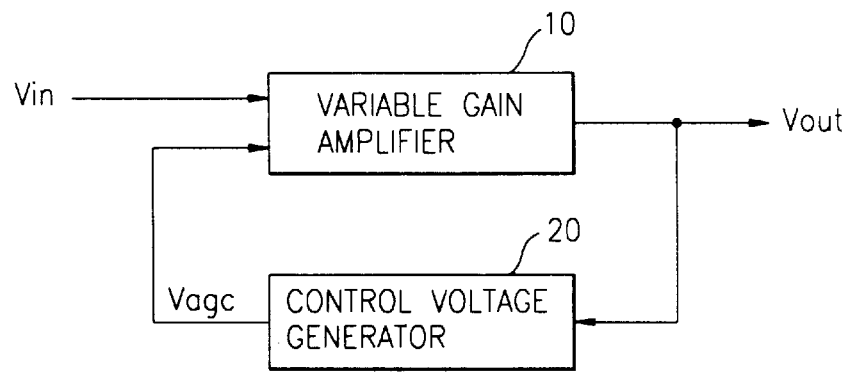
FIG. 1 is a block diagram showing a related art automatic gain control circuit.
Figure 2:
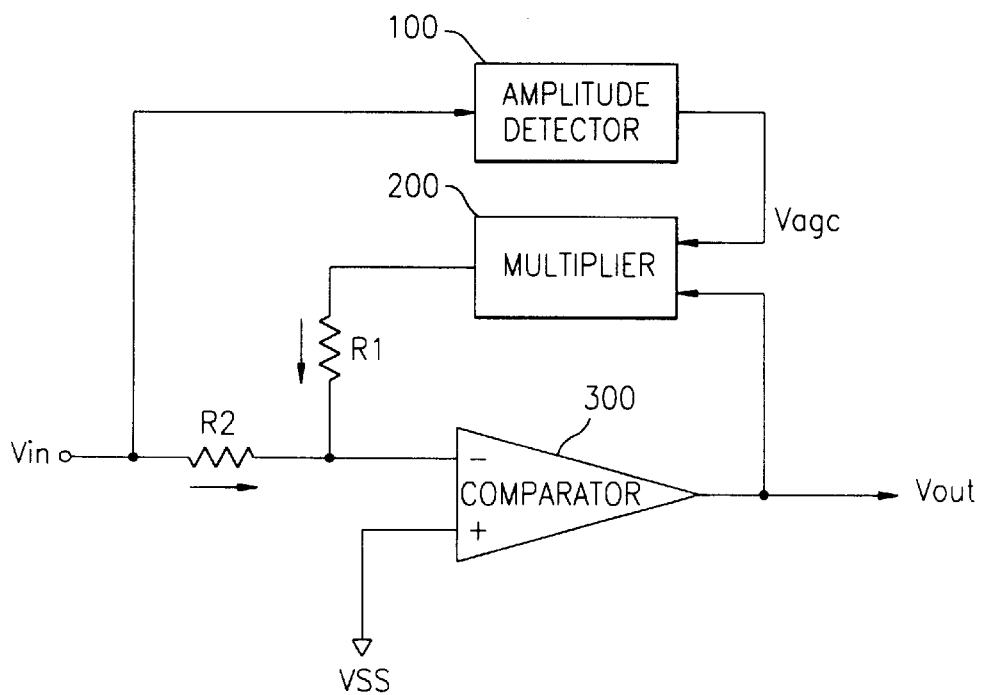
FIG. 2 is a block diagram showing a preferred embodiment of an automatic gain control circuit according to the present invention.

FIG. 2 is a diagram that illustrates a preferred embodiment of an automatic gain control circuit according to the present invention. As shown in FIG. 2, an amplitude detector 100 detects an amplitude of an input signal (Vin), which is preferably externally applied. A multiplier 200 multiplies an amplitude (Vagc) supplied from the amplitude detector 100 and an output signal (Vout) of the automatic gain control circuit, which is fed back to the mulitplier 200. The first preferred embodiment of the automatic gain control circuit further includes a comparator 300, a first resistance R1 and a second resistance R2.

The comparator 300 preferably includes an operational amplifier (OP). The op amp OP has an inversion terminal (−) coupled to an output terminal of the multiplier 200 across the first resistance R1 and coupled to an input terminal of the external input signal (Vin) across the second resistance R2. A non-inversion terminal (+) of the Op amp OP is grounded.

Operations of the preferred embodiment of the automatic gain control circuit will now be described. When the input signal (Vin) is externally applied, the amplitude detector 100 detects the amplitude of the input signal (Vin), and the multiplier 200 multiplies the amplitude (Vagc) supplied from the amplitude detector 100 and the signal (Vout), which is preferably externally outputted.

Voltage of a node K can be expressed in equation (2) as follows.

$$\frac{Vin}{R2} = -\frac{Vout * Vagc}{R1} \quad (2)$$

Accordingly, in equation (2), the signal output from the multiplier 200 applied across the first resistance R1 is equal to the input signal (Vin) applied across the second resistance R2. Equation (2) can also be expressed as equation (3) as follows.

$$Vout = -\frac{R1}{R2} * Vin * \frac{1}{Vagc} \quad (3)$$

For example, assuming that the input signal (Vin) is Asinωt, and Vagc is A, Equation (3) can be expressed in the following equation (4).

$$Vout = -\frac{R1}{R2} * A\sin\omega t * \frac{1}{A} = -\frac{R1}{R2} * \sin\omega t \quad (4)$$

As shown in equation (4), the output signal (Vout), which is determined by the ratio of the first resistance R1 and the second resistance R2, constantly has uniform size. Further, the gain of the output signal (Vout) is also determined by the first and second resistances R1, R2.

Figure 3A:
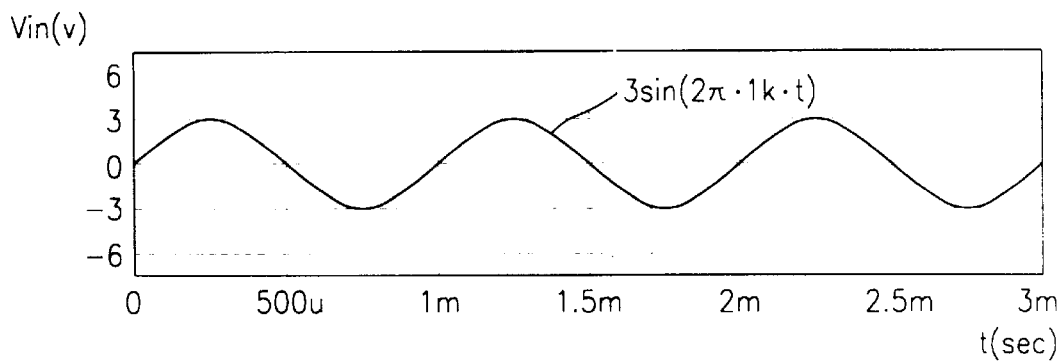
FIGS. 3A through 3C and 4A through 4C are waveform diagrams showing input/output signals according to the automatic gain control circuit of FIG. 2.
Figure 3B:
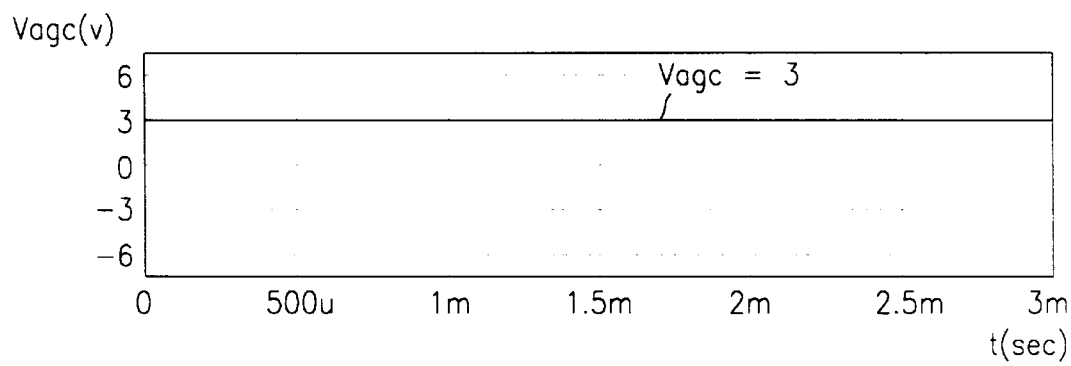

For a first example, if the first resistance R1 is 2 kΩ, the second resistance R2 is 1 kΩ and the input signal (Vin) is 3sin (2π*1k*t), the gain determination according to the preferred embodiment is as follows. FIG. 3A is a waveform diagram showing the input signal (Vin) equal to 3sin (2π*1k*t). FIG. 3B is a waveform diagram showing the amplitude (Vagc) equal to 3, which is outputted from the amplitude detector 100 in this example.

The output signal (Vout) is uniformly maintained as shown in equation (5) regardless of the size of the input signal (Vin).

$$Vout = 2\sin(2\pi * 1K * t) \quad (5)$$

Figure 3C:
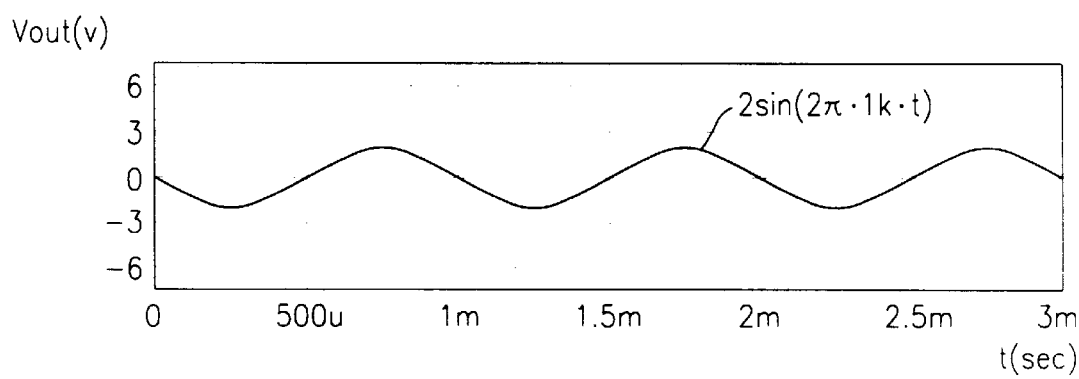

FIG. 3C is a waveform diagram showing the output signal (Vout). Accordingly, the first preferred embodiment provides an output signal having uniform gain regardless of the input signal size.

Figure 4A:
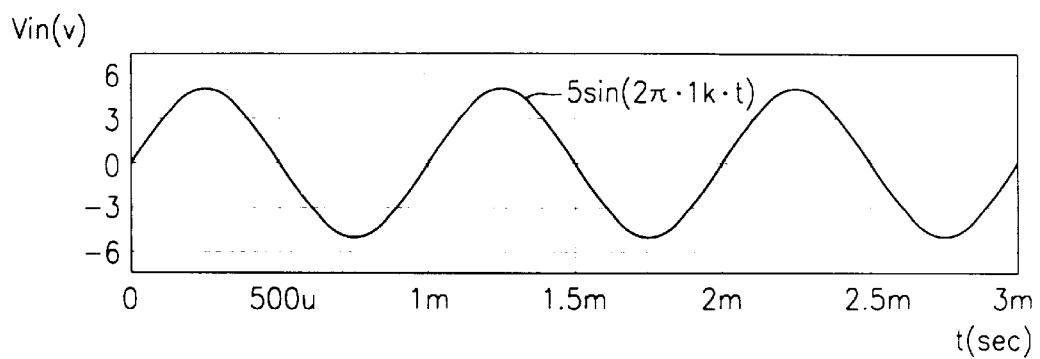
Figure 4B:
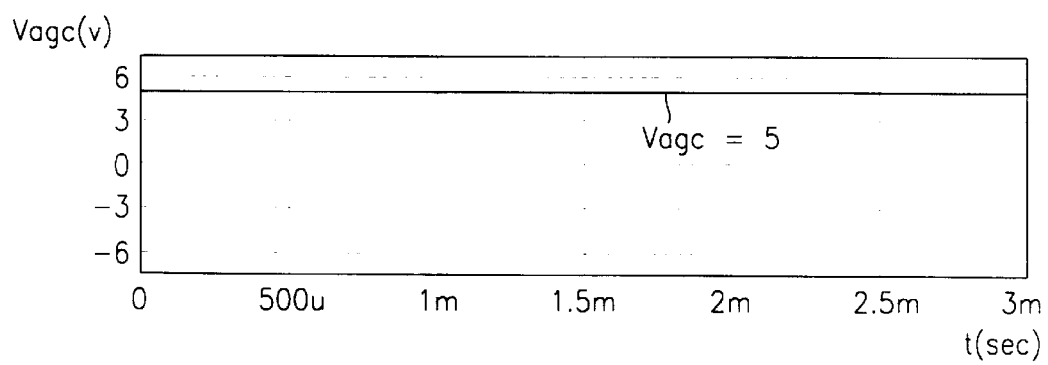
Figure 4C:
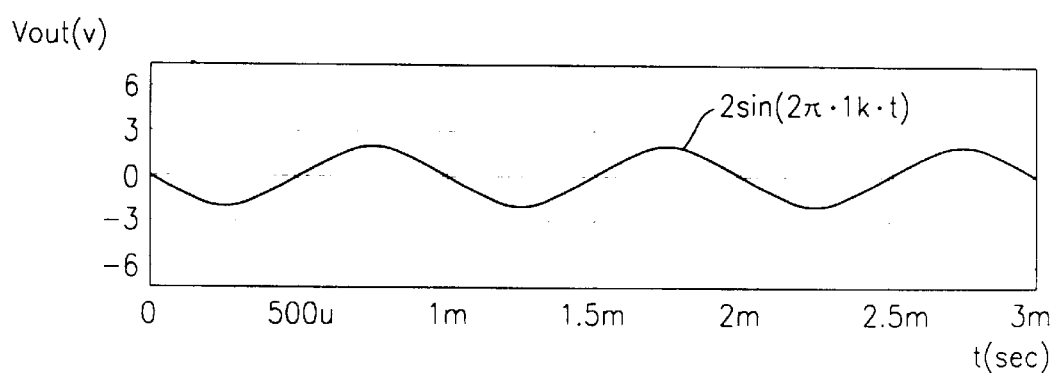

FIGS. 4A and 4B illustrate a second example of an input signal (Vin) and the amplitude (Vagc) from the amplitude detector 100, respectively, according to the preferred embodiment of an automatic gain control circuit according to the present invention. As shown in FIG. 4C, the output signal (Vout) supplied from the comparator 300 has the same size as Equation (5).

Accordingly, the automatic gain control circuit of the preferred embodiment of the invention constantly determines an output signal having a prescribed size regardless of the size of the input signal (Vin).

As described above, the preferred embodiment of the present invention has various advantages. By applying a multiplier and a negative feedback system, an output signal that has a uniform size can be obtained regardless of a size of an input signal. Further, the preferred embodiment does not need to provide a control voltage generation circuit that outputs a signal inversely proportional to the size of the output signal and that is difficult to embody.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An automatic gain control circuit, comprising:
    a detector circuit that receives a first signal;
    a multiplier circuit that receives an output signal of the detector circuit and a second signal;
    a first resistance coupled to the multiplier, wherein a first side of the first resistance receives an output signal of the multiplier circuit;
    a second resistance, wherein a first side of the second resistance receives the first signal; and
    a comparator circuit comparing signals applied to first and second input terminals to output the second signal, wherein second sides of the first and second resistances are mutually coupled to the first input terminal of the comparator circuit and a first prescribed voltage is coupled to the second input terminal.

2. The circuit of claim 1, wherein a size of the second signal is determined by the ratio of the first resistance and the second resistance regardless of a first signal size.

3. The circuit of claim 1, wherein a size of the second signal has a constant uniform size when a size of the input signal is varied.

4. The circuit of claim 1, wherein the first signal is an input signal and the second signal is an output signal of the automatic gain control circuit.

5. The circuit of claim 1, wherein the comparator circuit comprises an operational amplifier, and the output signal of the detector circuit is an amplitude of the first signal.

6. The circuit of claim 1, wherein the first input terminal is an inverting terminal and the second input terminal is a non-inverting terminal, wherein the first signal is externally applied, wherein the first and second resistances are resistors and wherein the first prescribed voltage is a ground voltage.

7. An automatic gain control circuit using a multiplier and a negative feedback system, comprising:

an amplitude detector that detects an input signal amplitude;

a multiplier that multiplies the input signal amplitude and an output signal of the automatic gain control circuit; and a comparator having inverting and non-inverting terminals, wherein the inverting terminal is coupled to an output terminal of the multiplier across a first resistance and to an input terminal supplying the input signal across a second resistance.

8. The circuit of claim 7, wherein the multiplier does not multiply the output signal of the automatic gain control circuit by a signal that is its inverse.

9. The circuit of claim 7, wherein gain of the automatic gain control circuit is determined by the ratio of the first resistance and the second resistance regardless of size of the input signal.

10. The circuit of claim 7, wherein size of the output signal is determined by the ratio of the first resistance and the second resistance regardless of size of the input signal.

11. The circuit of claim 7, wherein the output signal feeds back to the multiplier.

12. The circuit of claim 7, wherein the first signal is externally applied, wherein the comparator is an operational amplifier, and wherein the non-inverting terminal is coupled to a ground voltage.

13. A method of automatic gain control, comprising:

inputting an input signal;

variably amplifying the input signal to generate a uniform size output signal;

detecting an amplitude of the input signal; and multiplying the amplitude of the input signal and the uniform size output signal to generate a multiplied signal, wherein the amplifying step comprises, summing the input signal applied across a second resistance and the multiplied signal applied across a first resistance, and comparing the summed signal to a prescribed signal to output the uniform size output signal.

14. The method of claim 13, further comprising varying the size of the input signal.

15. The method of claim 14, wherein a size of the output signal is determined by the ratio of the first resistance and the second resistance regardless of size of the input signal.

16. The method of claim 13, wherein the amplifying step uses an operational amplifier that receives the input signal applied across the second resistance at a first terminal and the multiplied signal applied across the first resistance at the first terminal, and wherein the prescribed signal is a ground voltage received at a second terminal.

* * * * *